United States Patent
Lee et al.

(10) Patent No.: US 6,512,408 B2
(45) Date of Patent: *Jan. 28, 2003

(54) MIXER STRUCTURE AND METHOD FOR USING SAME

(75) Inventors: Kyeongho Lee, Seoul (KR); Deog-Kyoon Jeong, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/985,897

(22) Filed: Nov. 6, 2001

(65) Prior Publication Data

US 2002/0030529 A1 Mar. 14, 2002

Related U.S. Application Data

(63) Continuation of application No. 09/709,315, filed on Nov. 13, 2000, now Pat. No. 6,313,688, which is a continuation-in-part of application No. 09/121,863, filed on Jul. 24, 1998, now Pat. No. 6,164,947, and a continuation-in-part of application No. 09/121,601, filed on Jul. 24, 1998, now Pat. No. 6,335,952

(60) Provisional application No. 60/164,874, filed on Nov. 12, 1999.

(51) Int. Cl.[7] ................................................. G06F 7/44

(52) U.S. Cl. ..................... 327/359; 327/355; 327/356; 327/113; 455/333

(58) Field of Search ................................ 327/355, 356, 327/357, 361, 359, 113; 455/333, 326

(56) References Cited

U.S. PATENT DOCUMENTS

| | | | |
|---|---|---|---|
| 4,755,774 A | 7/1988 | Heck | 332/18 |
| 5,012,142 A | 4/1991 | Sonntag | 327/158 |
| 5,175,729 A | 12/1992 | Borras et al. | 370/345 |
| 5,179,303 A | 1/1993 | Searles et al. | 327/277 |
| 5,180,994 A | 1/1993 | Martin et al. | 331/38 |
| 5,408,201 A | 4/1995 | Uriya | 331/2 |
| 5,418,815 A | 5/1995 | Ishikawa et al. | 375/216 |
| 5,438,591 A | 8/1995 | Oie et al. | 375/261 |
| 5,448,772 A | 9/1995 | Grandfield | 327/357 |
| 5,507,025 A | 4/1996 | Rodeffer | 455/266 |
| 5,555,182 A | 9/1996 | Galm | 702/69 |
| 5,584,062 A | 12/1996 | Meador et al. | 455/260 |
| 5,614,868 A | 3/1997 | Nielson | 331/1 A |
| 5,640,146 A | 6/1997 | Campana et al. | 455/54.1 |
| 5,734,970 A | 3/1998 | Saito | 455/76 |
| 5,761,617 A | 6/1998 | Yonekura et al. | 455/343 |
| 5,794,119 A | 8/1998 | Evans et al. | 455/71 |

(List continued on next page.)

Primary Examiner—Dinh Thanh Le
(74) Attorney, Agent, or Firm—Fleshner & Kim, LLP (57) ABSTRACT

A mixer structure and method for using same in accordance with the present invention includes a multi-phase mixer. A VCO includes a plurality of differential delay cells to output a plurality of multi-phase clock signals. The multi-phase mixer can include a load circuit, switch circuit, noise reduction circuit and an input circuit. The switch circuit is coupled to receive the plurality of multi-phase clock signals and includes a first switch array and a second switch array coupled to the load circuit, respectively. The noise reduction circuit coupled to the switch circuit can include a transistor responsive to a bias voltage. The input circuit includes a transistor receiving the input signal. The first switch array includes a first plurality of switches coupled between a first output terminal and a second node, and the second switch array includes a second plurality of switches coupled between a second output terminal and the second node. Preferably, each of the plurality of switches includes two pairs of serially connected transistors, wherein the serially connected transistors are coupled in parallel to provide a symmetric electrical connection for each of two input ports. The mixer and method for using same can be single or double-balanced mixers receiving an RF input signal.

20 Claims, 8 Drawing Sheets

U.S. PATENT DOCUMENTS

| | | | |
|---|---|---|---|
| 5,861,773 A | 1/1999 | Meyer | 329/304 |
| 5,872,810 A | 2/1999 | Phillips et al. | 375/222 |
| 5,878,087 A | 3/1999 | Ichihara | 375/316 |
| 5,880,613 A | 3/1999 | Ishihara | 327/202 |
| 5,889,437 A | 3/1999 | Lee | 331/16 |
| 5,894,592 A | 4/1999 | Brueske et al. | 455/86 |
| 5,950,119 A | 9/1999 | McGeehan et al. | 455/302 |
| 5,963,855 A | 10/1999 | Lussenhop et al. | 455/226.2 |
| 6,029,059 A | 2/2000 | Bojer | 327/361 |
| 6,084,905 A | 7/2000 | Ishifuji et al. | 375/202 |
| 6,097,768 A | 8/2000 | Janesch et al. | 375/330 |
| 6,175,279 B1 | 1/2001 | Ciccarelli et al. | 330/296 |
| 6,194,947 B1 | 2/2001 | Lee et al. | 327/359 |

MIXER STRUCTURE AND METHOD FOR USING SAME

This application is a continuation of Application Ser. No. 09/709,315, filed Nov. 13, 2000, now U.S. Pat. No. 6,313, 688, which is a continuation-in-part of Application Ser. Nos. 09/121,863 filed Jul. 24, 1998 now U.S. Pat. No. 6,194,947 and 09/121,601 filed Jul. 24, 1998, now U.S. Pat. No. 6,335,952 and claims priority to Provisional Application No. 60/164,874 filed Nov. 12, 1999, the contents of which are incorporated by reference.

BACKGROUND OF THE INVENTION

1. Field of the Invention

The present invention relates to a mixer, and more particularly, to a multi-phase mixer and methods for using same.

2. Background of the Related Art

Presently, a radio frequency (RF) communications system has a variety of applications including PCS communication and IMT systems. As such, a CMOS chip integration of the system has been pursued to reduce the cost, size and power consumption.

Generally, the RF communication system is composed of RF front-end block and base-band digital signal processing (DSP) block. Currently, the base-band DSP block can be implemented with low cost and low power CMOS technology. However, the RF front-end cannot be implemented by CMOS technology due to fundamental limits in speed and noise characteristics, which are below the speed and noise specification of popular RF communication systems.

For example, the PCS hand-phone system operate at a frequency over 2.0 GHz, but current CMOS technology can support reliably operation only up to a frequency of 1.0 GHz in terms of speed and noise. Hence, the RF front-end block is implemented using bipolar or bi-CMOS technology that has better speed and noise characteristics than CMOS technology, but is more expensive and consumes more power.

Figure 1:
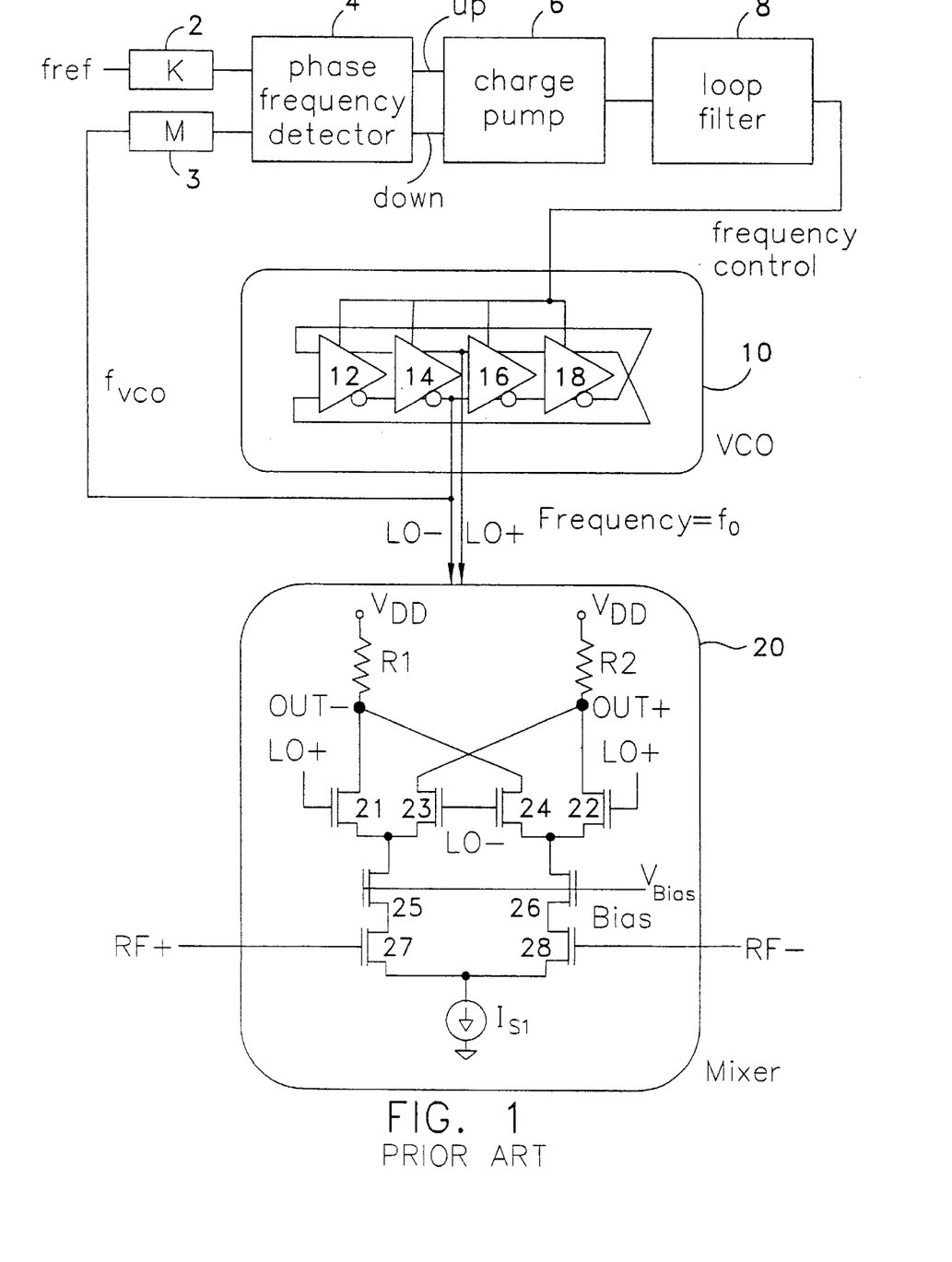
FIG. 1 is a circuit diagram of a related art VCO-mixer structure.

One of the main causes for the 1 GHz limitation is the structure of the VCO and the mixer. FIG. 1 is a circuit diagram of the VCO-mixer according to a background art. As shown in FIG. 1, the VCO 10 includes four differential delay cells 12, 14, 16 and 18 and has a structure similar to a ring oscillator. The four delay cells 12–18 are serially connected and generate a clock signal LO+ and an inverted clock signal LO−, each having a frequency of $f_0$. A control circuit for the VCO 10 that generates a frequency control signal includes a phase frequency detector 4, a charge pump 6 and a loop filter 8 that outputs the frequency control signal to each of the delay cells 12–18. The phase frequency detector 4 receives a reference clock signal $f_{ref}$ and a VCO clock signal $f_{vco}$ from a reference clock divider circuit 2 and a VCO clock divider circuit 3, respectively. The frequency $f_0$ of the clock signals LO+ and LO− is represented by M/K $(f_{ref})=f_0$. Thus, the frequency $f_0$ is based on the reference clock signal $f_{ref}$ and the divider circuits 2 and 3.

The mixer 20, such as Gilbert—Multiplier, multiplies the input signals, such as radio frequency (RF) signals RF+ and RF−, with the clock signals LO+ and LO−. The mixer 20 includes two load resistors R1 and R2 coupled to a source voltage $V_{DD}$, eight NMOS transistors 21–28, and a current source $I_{S1}$. The gates of the NMOS transistors 21 and 22 are coupled to receive the clock signal LO+, and the gates of the NMOS transistors 23 and 24 are coupled to receive the inverted clock signal LO−. The gates of the NMOS transistors 25 and 26 receive a common bias voltage $V_{Bias}$. The gates of the NMOS transistors 27 and 28 receive the RF signals RF+ and RF−, respectively. Therefore, the clock signals LO+ and LO− are multiplied with the RF signals RF+ and RF− only when the transistors 25 and 27 or the transistors 26 and 28 are turned on together. The output signals OUT+ and OUT− of the mixer 20 has a frequency lower than its original frequency by the frequency $f_0$ of the clock signals LO+, LO−.

As discussed above, a wide frequency range and a low phase noise are desirable for various applications. However, the VCO-mixer structure 10 and 20 can only support up to a frequency 1 GHz with reliable phase noise and frequency range. The performance of the VCO-mixer structure 10 and 20 becomes worse in terms of phase noise and frequency range and is unacceptable as the frequency of the clock signals LO+ and LO− from the VCO increases. Hence, the VCO 10 and the mixer 20 cannot be readily implemented when the frequency $f_0$ of the clock signals LO+ and LO− is over 1 GHz.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

A further object of the present invention is to provide a VCO-mixer and method for using same on a single substrate.

Another object of the present invention is to increase the frequency range of a apparatus mixer and method.

Still another object of the present invention is to provide a mixer and method for using same having reduced noise.

Another object of the present invention is to increase a performance of the mixer structure.

A further object of the present invention is to provide a single/double balanced mixer and method having a symmetric switch structure.

A further object of the present invention is to fabricate a RF communications receiver on a single substrate.

A further object of the present invention is to provide a RF communications transceiver and method including a multi-phase mixer on a single substrate.

To achieve the advantages and in accordance with the purpose of the present invention, as embodied and broadly described, there is provided a circuit that includes a mixer that receives a plurality of first clock signals having different phases, each first clock signal having a first frequency which is less than a reference frequency, wherein the mixer mixes the plurality of first clock signals to generate a plurality of local oscillator signals therein having a higher second frequency, and wherein the mixer multiplies the plurality of local oscillator signals with input signals to provide output signals at output terminals.

To further achieve the advantages and in accordance with the purpose of the present invention, as embodied and broadly described, there is provided a method for modulating input signals that includes generating a plurality of first clock signals having different phases, each first clock signal having a first frequency that is less than a reference frequency of an input signal, combining the plurality of first clock signals to generate a plurality of local oscillator signals having a second frequency higher than the first frequency and mixing the plurality of local oscillator signals with the input signal to provide an output signal.

To further achieve the advantages and in accordance with the purpose of the present invention, as embodied and broadly described, there is provided a receiver that includes an antenna that receives input signals being analog RF signals, a low noise amplifier coupled to the antenna, a clock generator that receives a reference signal having a reference frequency that generates a plurality of first clock signals having N different phases, N being an integer greater than two, each first clock signal having a first frequency substantially equal to double the reference frequency divided by N, a mixer coupled to the clock generator and the low noise amplifier that receives the plurality of first clock signals to generate at least one local oscillator signal therein having approximately the second frequency, wherein the mixer multiplies the at least one local oscillator signal with input signals to provide output signals at output terminals, a channel selection filter that removes an out-of-band signal from the demodulated baseband signal and an analog-to-digital converter that converts the demodulated baseband signal to a digital data stream.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 2A:
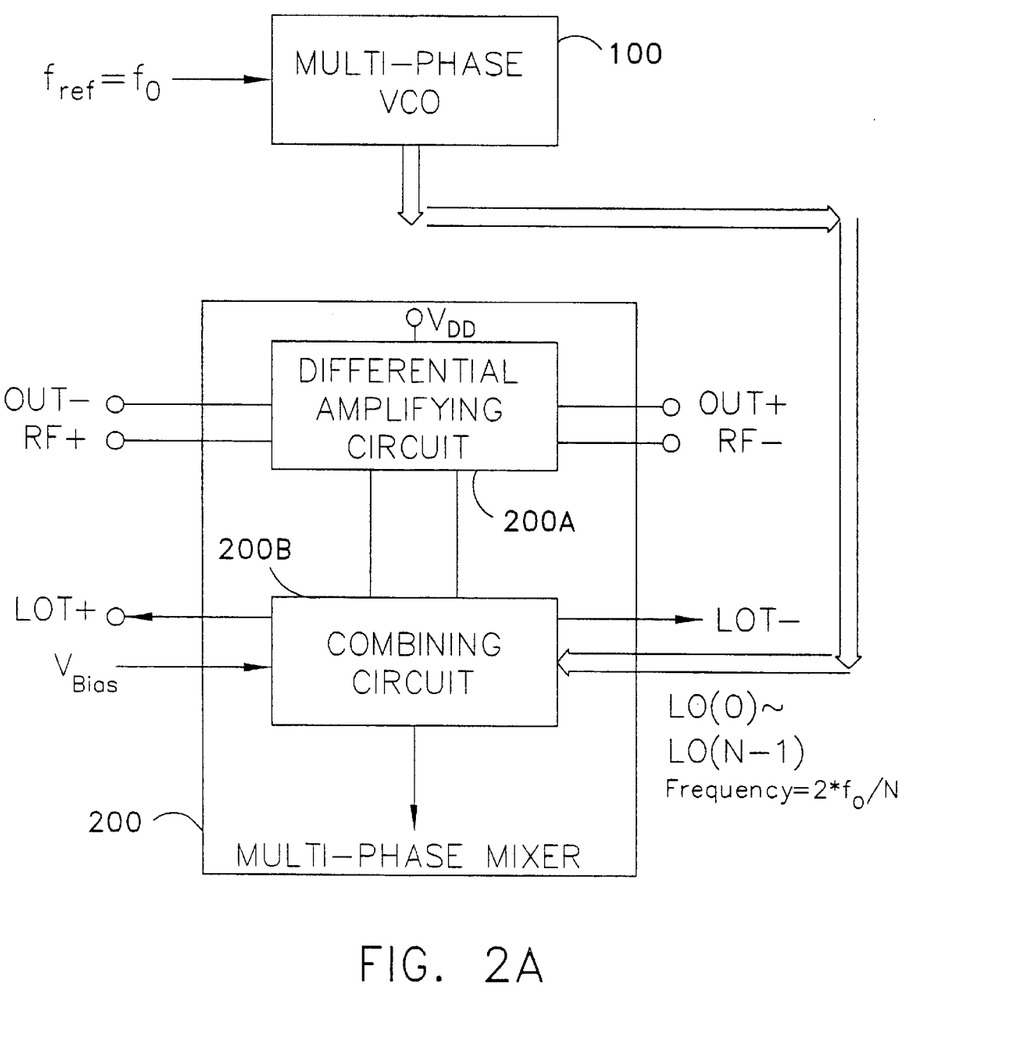
FIG. 2A is a block diagram showing a VCO-mixer structure according to a preferred embodiment of the present invention.

FIG. 2A is a block diagram that illustrates a VCO-mixer structure in accordance with a first preferred embodiment of the present invention. The structure can be used for a RF communications system. The structure includes a multi-phase voltage controlled oscillator VCO 100 and a multi-phase mixer 200. The multi-phase mixer 200 includes a differential amplifying circuit 200A and a combining circuit 200B.

When a reference clock signal having a reference frequency of $f_{REF}=f_0$ is used, the multi-phase VCO 100 generates a plurality of N-phase clock signals LO (i=0 to N-1) having a frequency of $2*f_0/N$, where $N=N_D*2$ and $N_D$ equals the number of delay cells in the multi-phase VCO 100. In other words, the VCO 100 reduces the frequency $f_0$ to $2*f_0/N$. The frequency $2*f_0/N$ reduces the phase noise of the multi-phase VCO and increases the frequency range.

The plurality of N-phase intermediate clock signals LO(0), LO(1), ... LO(N-1) having a frequency of $2*f_0/N$ is inputted into the combining circuit 200B of the multi-phase mixer 200, and the input signals, for example, RF signals RF+ and RF− are inputted into the differential amplifying circuit 200A. The differential amplifying circuit 200B differentially amplifies the radio frequency signals RF+ and RF−. The combining circuit 200B is responsive to a bias voltage $V_{Bias}$ and preferably combines the N-phase intermediate clock signals LO(0)–LO(N-1) to generate the output clock signals LOT+ and LOT− having the original frequency $f_0$. The mixer 200 then accomplishes a multiplication of the output clock signals LOT+ and LOT− and the RF signals RF+ and RF−.

Figure 2B:
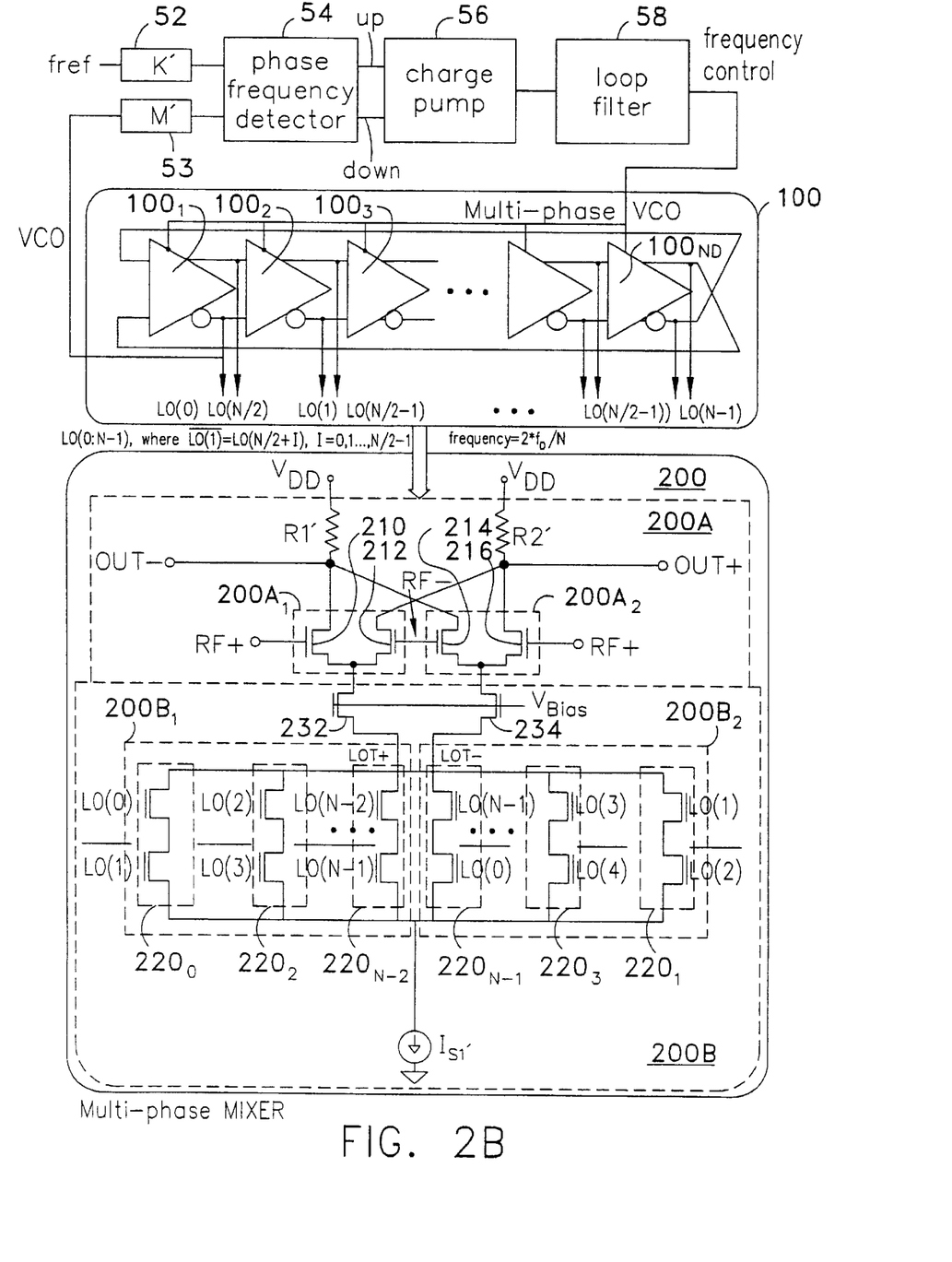
FIG. 2B is a circuit diagram showing a VCO-mixer structure of FIG. 2A.

FIG. 2B illustrates a circuit diagram of the VCO-mixer structure 100, 200 in accordance with a first preferred embodiment. The multi-phase VCO 100 includes $N_D$ number of delay cells $100_1$–$100_{ND}$ coupled in series. Based on such configuration, the multi-phase VCO generates a plurality of N-phase intermediate clock signals LO(0)–LO(N-1) having a frequency of $2*f_0/N$. A control circuit for the VCO 100 that generates a frequency control signal includes a phase frequency detector 54, a charge pump 56 and a loop filter 58 that outputs the frequency control signal to each of the delay cells $100_1$–$100_{ND}$. The phase frequency detector 54 receives a reference clock signal $f_{ref}$ and a VCO clock signal $f_{vco}$ from a reference clock divider circuit 52 and a VCO clock divider circuit 53, respectively. The frequency $2f_0/N$ of the clock signals LO(φ)–LO(N-1) is represented by $M'/K'(f_{ref})=2f_0/N$. Thus, the frequency $f_0$ is based on the reference clock signal $f_{ref}$ and the divider circuits 52 and 53. In other words, $f_{vco}$ can be $2f_0/N$ by setting M'/K' of the divider circuits 52 and 53.

The differential amplifying circuit 200A of the multi-phase mixer 200 includes two load resistors R1' and R2' coupled to two differential amplifiers $200A_1$ and $200A_2$, respectively. The differential amplifier $200A_1$ includes two NMOS transistors 210 and 212, and the differential amplifier $200A_2$ includes two NMOS transistors 214 and 216. The drains of the NMOS transistor 210 and 216 are coupled to the load resistors R1' and R2', respectively, and the gates of the NMOS transistors 210 and 216 are coupled for receiving the RF signal RF+. Further, the drains of the NMOS transistors 212 and 214 are coupled to the load resistors R2' and R1', respectively, and the gates are coupled for receiving the RF signal RF−. The sources of NMOS transistors 210 and 212 and NMOS transistors 214 and 216 are coupled to each other and to the combining circuit 200B of the multi-phase mixer.

The differential amplifiers $200A_1$ and $200A_2$ differentially amplifies the RF signals RF+ and RF−, respectively, such that a more accurate output signals OUT− and OUT+ can be obtained. Further, the differential amplification removes noise that may have been added to the RF signals RF+ and RF−. As shown in FIG. 2B, the mixer 200 is a type of multi-phase double-balanced mixer. In this preferred embodiment, two differential amplifiers $200A_1$ and $200A_2$ are included, however, the present invention may be also accomplished using only one of the differential amplifiers in alternative embodiments.

The combining circuit 200B includes bias NMOS transistors 232 and 234, first combining unit 200B$_1$ and second combining unit 200B$_2$ coupled to the bias NMOS transistors 232 and 234, respectively, and a current source I$_{s1}$ coupled to the first and second combining units 200B$_1$ and 200B$_2$. The first combining unit 200B$_1$ includes a plurality of transistor units 2200$_0$, 2202$_2$, . . . 220$_{N-2}$, and the second combining unit includes a second plurality of transistor units 2201$_1$, . . . 220$_3$, . . . 220$_{N-1}$.

Preferably, each of the plurality of transistor units includes a plurality of serially connected transistors, wherein the serially connected transistors are coupled in parallel with the serially connected transistors of the plurality of transistor units. Preferably, each transistor unit includes two (2) serially connected transistors. Hence, in the preferred embodiment, there are a total of N/2 number of transistor units in each combining unit 200A or 200B, such that the total number of NMOS transistors is 2*N.

The gate of the bias NMOS transistors 232 and 234 are coupled for receiving the bias voltage V$_{Bias}$, and the gates of the transistors in the first and second plurality of transistor units are coupled for receiving a corresponding N-phase intermediate clock signals LO(i) and /LO(i) having a frequency of 2*f$_0$/N, where /LO(i)=LO(N/2+i), i=0, 1 . . . , N/2−1. In this preferred embodiment, the bias NMOS transistors 232 and 234 are included for prevention of error, however, such transistors may be omitted in alternative embodiments. Further, the sequential ON-OFF operation of the 2*N number NMOS transistors of the combining circuit 200B is equivalent to a NAND logic circuit, which can be interchanged with other equivalent logic circuits and structure in alternative embodiments.

The generic FIG. 2B structure allows integration of the multi-phase VCO 100 and multi-phase mixer 200 on a single chip, i.e., on a single semiconductor substrate using CMOS technology. Such structure and layout reduce noise including noise caused by parasitic capacitances. As described above, the differential amplification using the RF signals RF+ and RF− in the differential amplifying circuit 200A reduces noise.

The reduction of the reference frequency f$_0$ to N-phase intermediate clock signals LO(i) having a frequency of 2*f$_0$/N also reduces noise. When a plurality of transistors are formed on the same substrate, such as a semiconductor substrate for CMOS technology, a plurality of P-N junctions are formed in the substrate. The parasitic capacitances mostly exist at the P-N junctions. If the frequency of a signal applied to the gate of the transistor is very high, the higher frequency of f$_0$ causes much more noise compared to a reduced frequency of 2*f$_0$/N.

Further, the operation of the differential amplifier circuit 200A and the combining circuit 200B is dependent on the output clock signals LOT+ and LOT− having a frequency of f$_0$, which are provided by the first combining unit 200B$_1$ and second combining unit 200B$_2$, respectively, by combining the N-phase intermediate clock signals LO(i) having a frequency of 2*f$_0$/N. When the bias voltage V$_{Bias}$ is applied, the NMOS transistors 232 and 234 are turned ON and OFF based on the output clock signals LOT+ and LOT−. Although the NMOS transistors 210, 212, 214 and 216 are turned ON by the RF signals RF+ and RF− applied to the gate electrodes, the amplification of the RF signals RF+ and RF− and the output clock signals LOT+ and LOT− for generating the output signals OUT+ and OUT− is performed when the bias NMOS transistors 232 and 234 are turned on by the clock signals LOT+ and LOT−.

Figure 3:
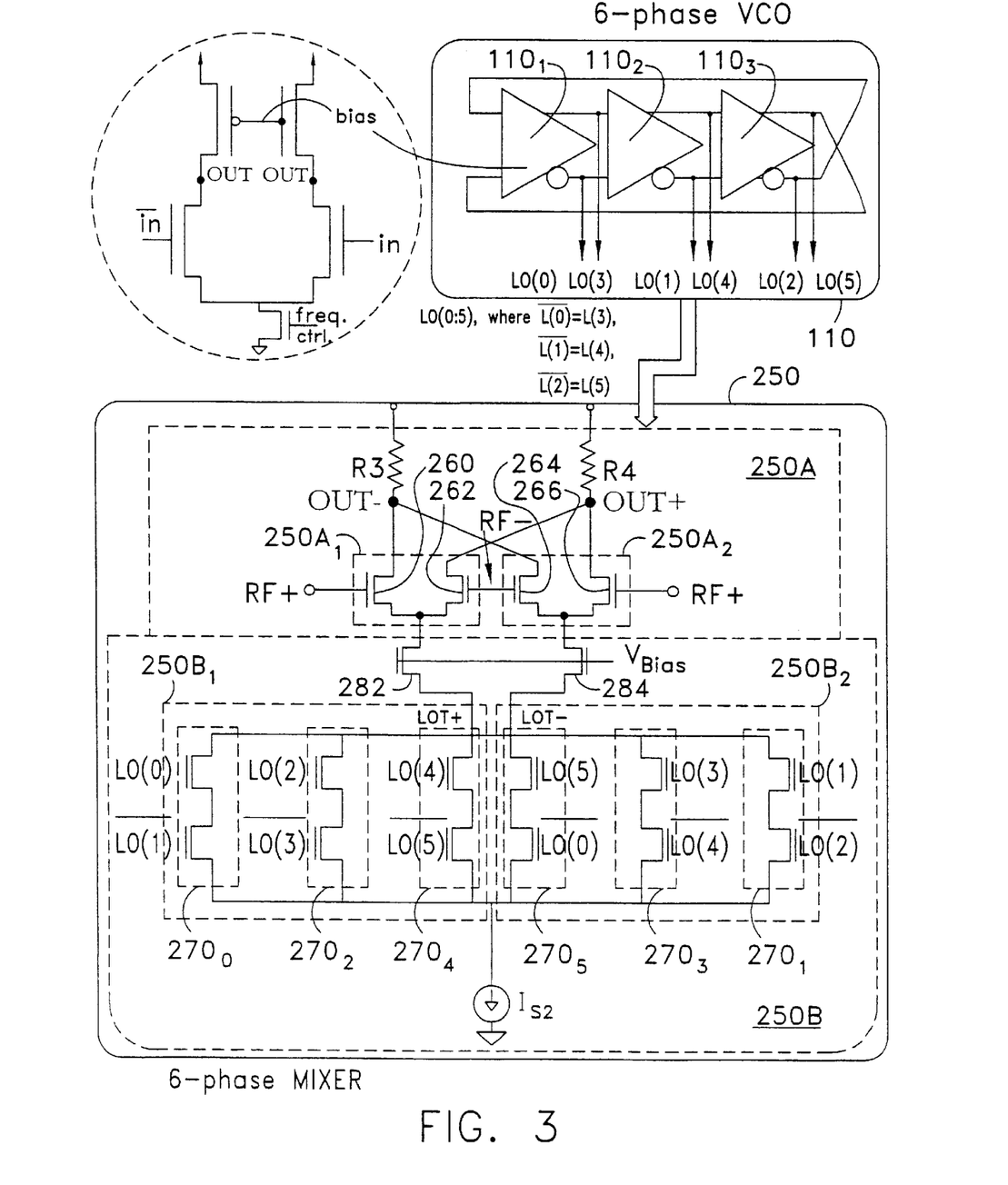
FIG. 3 is a circuit diagram showing the VCO-mixer according to another preferred embodiment of the present invention.

FIG. 3 illustrates a second preferred embodiment of the multi-phase VCO and the multi-phase mixer when N$_D$=3 and N=6, and FIGS. 4A–4H illustrate the operational timing diagrams of the FIG. 3 preferred embodiment. As shown, the multi-phase VCO 110 includes three delay cells 110$_1$–110$_3$ to generate 6-phase intermediate clock signals LO(0)–LO (5). An exemplary circuit including five transistors for the delay cells 110$_1$–110$_3$ (i.e., the delay cell 110$_1$) is also shown. For illustrative purposes only, if the input clock signal has a frequency of f$_0$=1.5 GHz, the 6-phase intermediate clock signals LO(0)—LO(5) will have a frequency of 0.5 GHz.

The 6-phase mixer 250 includes a differential amplifying circuit 250A and a combining circuit 250B. The differential amplifying circuit 250A includes a first differential amplifier 250A$_1$ having NMOS transistors 260 and 262 and a second differential amplifier 250A$_2$ having NMOS transistors 264 and 266, which are coupled to load resistors R3 and R4, respectively. The combining circuit 250B includes a first combining unit 250B$_1$ and 250B$_2$, which are commonly coupled to a current source I$_{S2}$. The first and second combining units 250B$_1$ and 250B$_2$ are coupled to the first and second differential amplifiers 250A$_1$ and 250A$_2$ through bias NMOS transistors 282 and 284, respectively, which are biased by a bias voltage V$_{Bias}$. Cumulatively, the first and second combining units 250B$_2$ and 250B$_1$ includes six transistor units 270$_0$–270$_5$ with a total of twelve transistors.

As shown in FIGS. 4A–4F, the 6-phase VCO 110 generates 6-phase intermediate clock signals LO(1)–LO(5) having the reduced frequency f$_0$/3. The 6-phase mixer 250 receives the 6-phase intermediate clock signals LO(1)–LO (5) and the RF signals RF+ and RF−. Each intermediate clock signal LO(1)–LO(5) and /LO(0)–LO(2), where/LO (0)=LO(3), /LO(1)=LO(4) and /LO(2)=LO(5), is applied to a corresponding transistor of the first and second combining units 250B$_1$ and 250B$_2$. The first and second combining units 250B$_1$ and 250B$_2$ combine the 6-phase intermediate clock signals LO(0), LO(1), . . . LO(4), LO(5) having the frequency f$_0$/3 to generate the output clock signals LOT+ and LOT− having the frequency f$_0$.

As shown in FIGS. 4A–4H, when LO(0) is high and LO(1) is low (LO(4)=high), the two output signals LOT+ and LOT− are low and high, respectively. When LO(1) is high and LO(2) is low (LO(5)=high), the output signals LOT+, LOT− are high and low, respectively. When LO(2) is high and LO(3) is low (LO(0)=high), the output signals LOT+ and LOT− are low and high, respectively. When LO(3) is high and LO(4) is low (LO(1)=high), the output signals LOT= and LOT− are high and low, respectively. When LO(4) is high and LO(5) is low (LO(2)=high), the output signals LOT+ and LOT− of the mixer 503 are low and high, respectively. When LO(5) is high and LO(0) is low (LO(3)=high), the output signals LOT+ and LOT− are low and high, respectively.

Figures 4A, 4B:
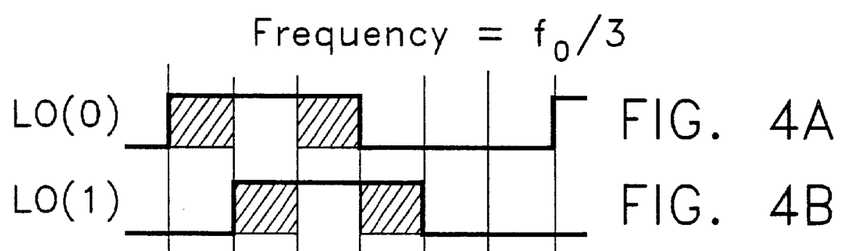
FIGS. 4A–4H are operational timing diagrams showing a mixer of FIG. 3.
Figure 4C:
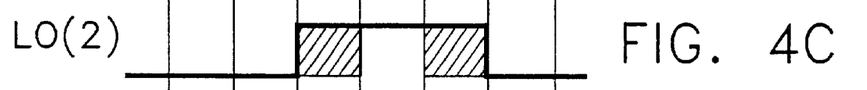
Figure 4D:
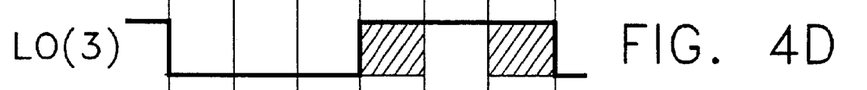
Figures 4E, 4F:
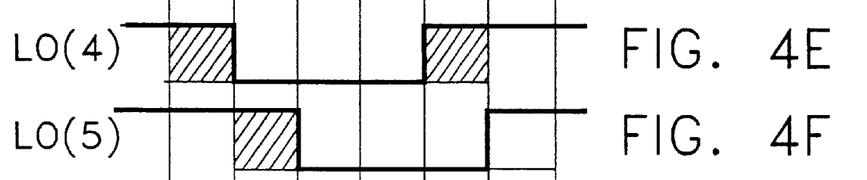
Figure 4G:
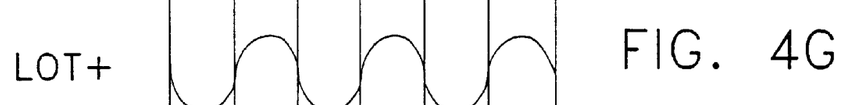
Figure 4H:
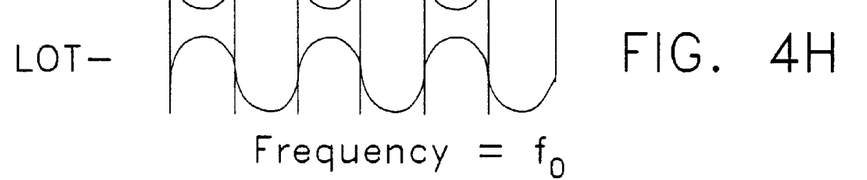

Each pair of NMOS transistors in the combining circuit are turned on in order, thereby producing the output signals LOT= and LOT−, as shown in FIGS. 4G and 4H.

Figure 5:
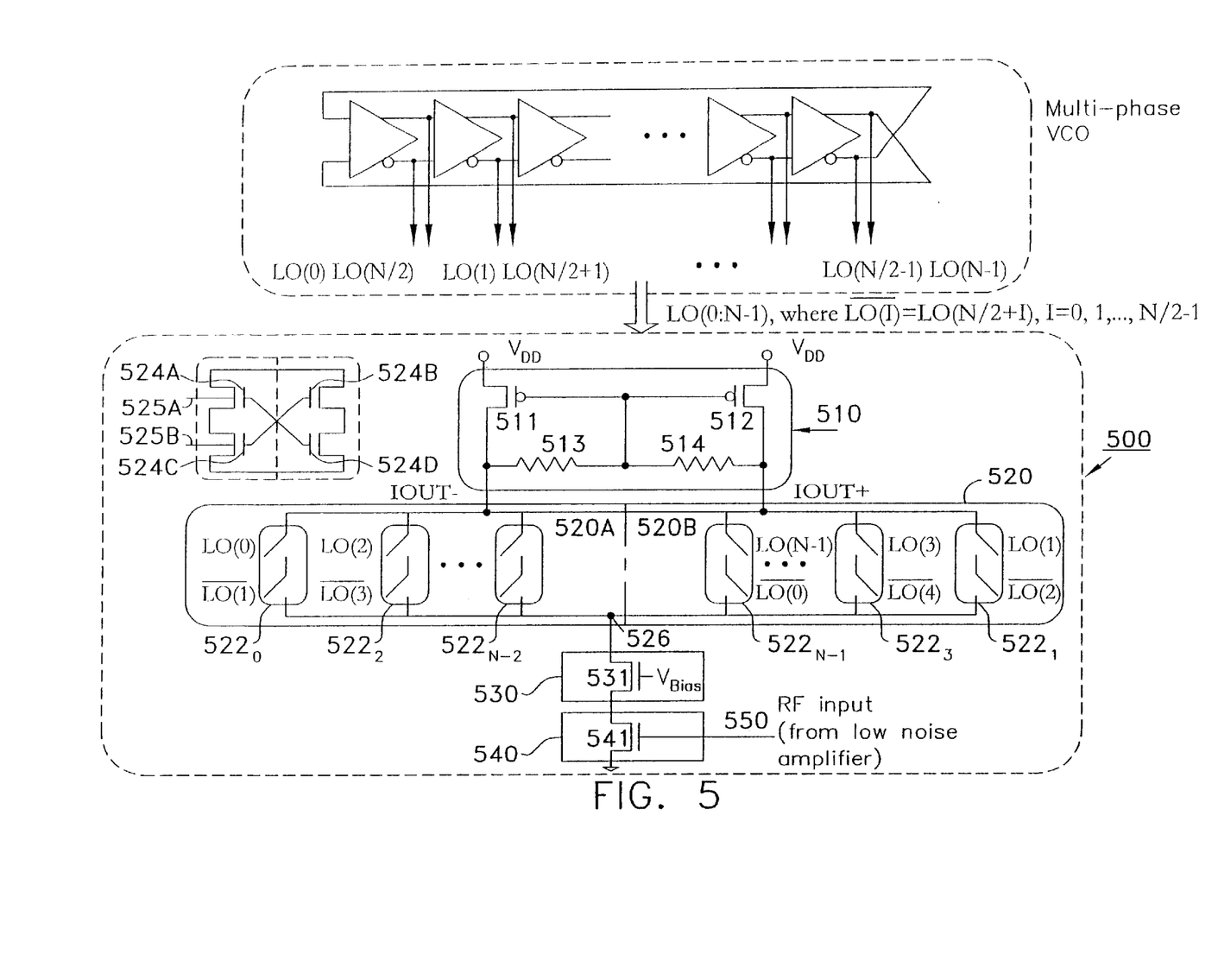
FIG. 5 is a circuit diagram showing yet another preferred embodiment of a mixer according to the present invention.

FIG. 5 illustrates a third preferred embodiment of a multi-phase single balanced mixer according to the present invention. The third preferred embodiment of a multi-phase mixer 500 is a type of single balanced mixer. The multi-phase mixer 500 preferably receives N-phase, 2*f$_0$/N MHz LO clocks (LO(0:N-1) and an RF signal and performs multiplication equivalent a single balanced mixer, which receives a single-phase f$_0$ MHz LO clock and the RF signal.

The multi-phase single balanced mixer 500 preferably includes four functional blocks being a load block 510, a switch array block 520, a noise reduction block 530 and an input block 540. As shown in FIG. 5, load block 510 preferably includes two PMOS transistors 511, 512 and two load resistors 513, 514. The two PMOS transistors 511, 512 have source electrodes coupled to a source voltage $V_{DD}$ and gate electrodes commonly coupled together. The load resistors 513, 514 are respectively coupled between the gate electrodes and drain electrodes of the PMOS transistors 511, 512.

The PMOS transistors 511, 512 preferably are operating on a saturation region to provide high-impedance, and the resistors 513, 514 serve as a load resistance. The parallel combination of the resistor 513 and the output impedance of PMOS transistor 511 operates close to just the resistance of the resistor 513 because the output impedance of transistor 511 is large compared with the resistor 513. Similarly, the parallel combination of the resistor 514 and the output impedance of transistor 520 is close to just the resistor 516. The drain electrodes of the transistors 511 and 520 are respectively coupled to first and second switch networks 520A and 520B of a switch array block 520 that perform multiplication of the multi-phase clock. A first switch network 520A includes a plurality of transistor units $522_0$, $522_2$, ..., $522_{N-2}$, and a second switch network 520B includes a second plurality of transistor units $522_1$, $522_3$, ..., $522_{N-1}$.

Preferably, the N-phase single-balanced mixer 500 receives N-phase clock signals LO[0:N-1] and the RF signal. In a six-phase mixer, the LO signals would be LO[0:5]. As shown in FIGS. 4G–4H, the switch array block 520 provides a mechanism to obtain the resultant effect equivalent to applying a single phase signal whose frequency is $F_0$ by using the N-phase LO signals whose frequency is $2*f_0/N$. The N-phase single-balanced mixer 500 according to the third preferred embodiment includes N switches controlled by N-phase LO signals. One of the $$\frac{N}{2}$$

switches $522_i$ in the first switch network 520A and one of the $$\frac{N}{2}$$

switches $522_j$ in the second switch network 520B is alternately turned on at every phase interval as shown in FIGS. 4A–4F. As a result, virtual waveforms LOT+ and LOT− as shown in FIGS. 4G–4H are obtained by the multi-phase operation at output terminal IOUT− and IOUT+, respectively.

Preferably, each of the switches $522_0$–$522_{N-1}$ includes at least first and second pluralities of serially coupled transistors. Thus, as shown in FIG. 5, each of the switches $522_0$–$522_N$ includes transistor 524A coupled in series with transistor 524C and transistor 524B connected in series with transistor 524D. Further, gate electrodes of the transistors 524A and 524D are commonly coupled to receive a corresponding multi-phase clock signal LO (e.g., LO(0)), and gate electrodes of the transistors 524B and 524C are commonly coupled to receive a corresponding multi-phase clock signal LO (e.g., LO (1)B). The transistors 524A and 524B further have source electrodes coupled to the load block 510 at the output terminal IOUT−, and the transistors 524C and 524D have source electrodes coupled to a node 526.

Preferably, each of the switches $522_0$–$522_{N-1}$ includes four NMOS transistors. Hence, in the third preferred embodiment, there are N/2 number of switches in each of the first and second switch networks 520A or 520B, such that the total number of NMOS transistors is 4*N. In addition, each of the switches $522_0$–$522_{N-1}$ includes symmetric NMOS transistors to provide an equivalent or symmetric electrical conditions to the two input ports 525A, 525B of each of the switches $522_0$–$522_{N-1}$.

A noise reduction block 530 preferably includes a cascode NMOS transistor 531 whose gate electrode is coupled to a bias voltage $V_{Bias}$. The noise reduction block operates to isolate the input block from the switch network 520 to prohibit noise coupling to an input RF signal 550. In the third preferred embodiment, the bias NMOS transistor 531 is included to prevent error, however, such transistors enabled by the bias voltage $V_{Bias}$ can be omitted in alternative embodiments.

An input block 540 includes NMOS transistor 541 coupled to receive the RF input signal 550 preferably from a low noise amplifier at a gate electrode. The transistor 541 is coupled between the transistor 531 and the ground voltage. The input voltage of the transistor 540 is converted to a current level by the transconductance of the transistor 541. The plurality of N-phase clock signals LO(0), LO(1), ..., LO(N-1) having a frequency of $2*f_0/N$ is inputted into the switch array block 520 of the multi-phase mixer 500, and the RF input signal 550 is inputted into the transistor 541.

The load block 510 can amplify the RF input signal 500 when the switch array block 520 preferably combines the N-phase clock signals LO(0)–LO(N-1) to generate the output clock signals LOT+ and LOT− having the original frequency $f_0$ responsive to the transistor 531 receiving the bias voltage $V_{Bias}$ at the output terminals IOUT−, IOUT+. The mixer 500 then accomplishes a multiplication of the output clock signals LOT+ and LOT− and the RF input signal 550. As a result, the multi-phase single-balanced mixer 500 can perform the operation equivalent to applying the high-frequency $f_0$ signal by using the reduced-frequency multi-phase LO clock signals.

Figure 6:
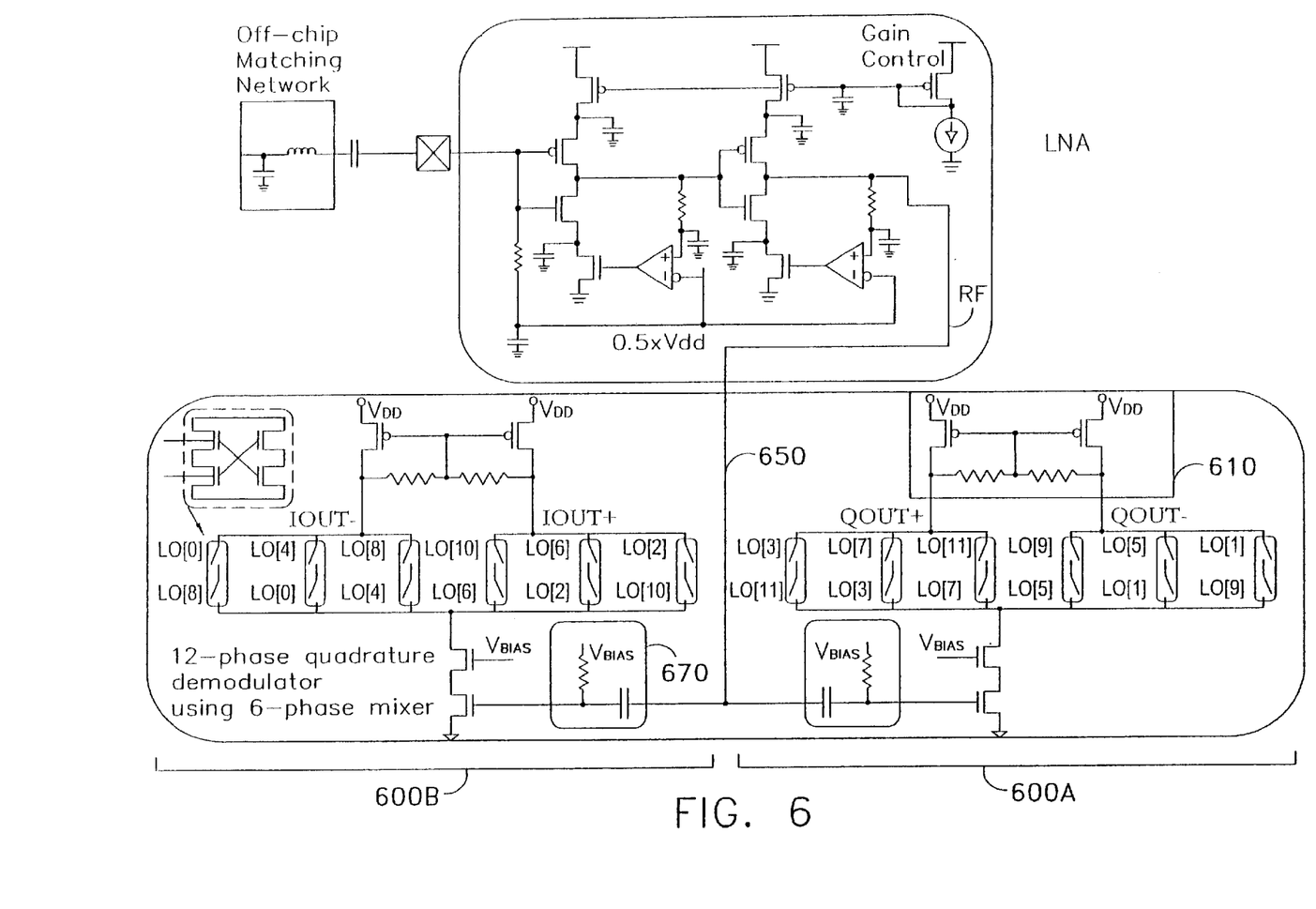
FIG. 6 is a circuit diagram showing an exemplary quadrature down converter according to the third preferred embodiment.

As an example, in an RF communication system, a 12-phase quadrature down converter as shown in FIG. 6 can be composed of two six-phase single-balanced mixers 600A, 600B according to the third preferred embodiment. As shown in FIG. 6, six-phase LO signals (LO[0, 2, 4, 6, 8, 10]) are used for an I-channel down conversion and the remaining six-phase LO signals (LO [0, 3, 5, 7, 9, 11]) are used for Q-channel down conversion. Each of the six-phase mixers in FIG. 6 using six-phase LO signals having the frequency $f_0/3$ MHz perform the same functionality as a single-balanced mixer with the $f_0$ MHz single-phase LO signal. The third preferred embodiment of the mixer structure allows the use of a large amplitude LO[0:11] signals having reduced rise/fall times, and thus increases mixer conversion gains and decreases noise. To provide a more accurate output signal at the I and Q output terminals IOUT−, IOUT+, QOUT−, QOUT+, resistor and capacitor pairs 670 can be added to an input path of an RF signal 650. Further, a load block 610 can be shared by the mixers 600A, 600B in alternative embodiments.

Figure 7:
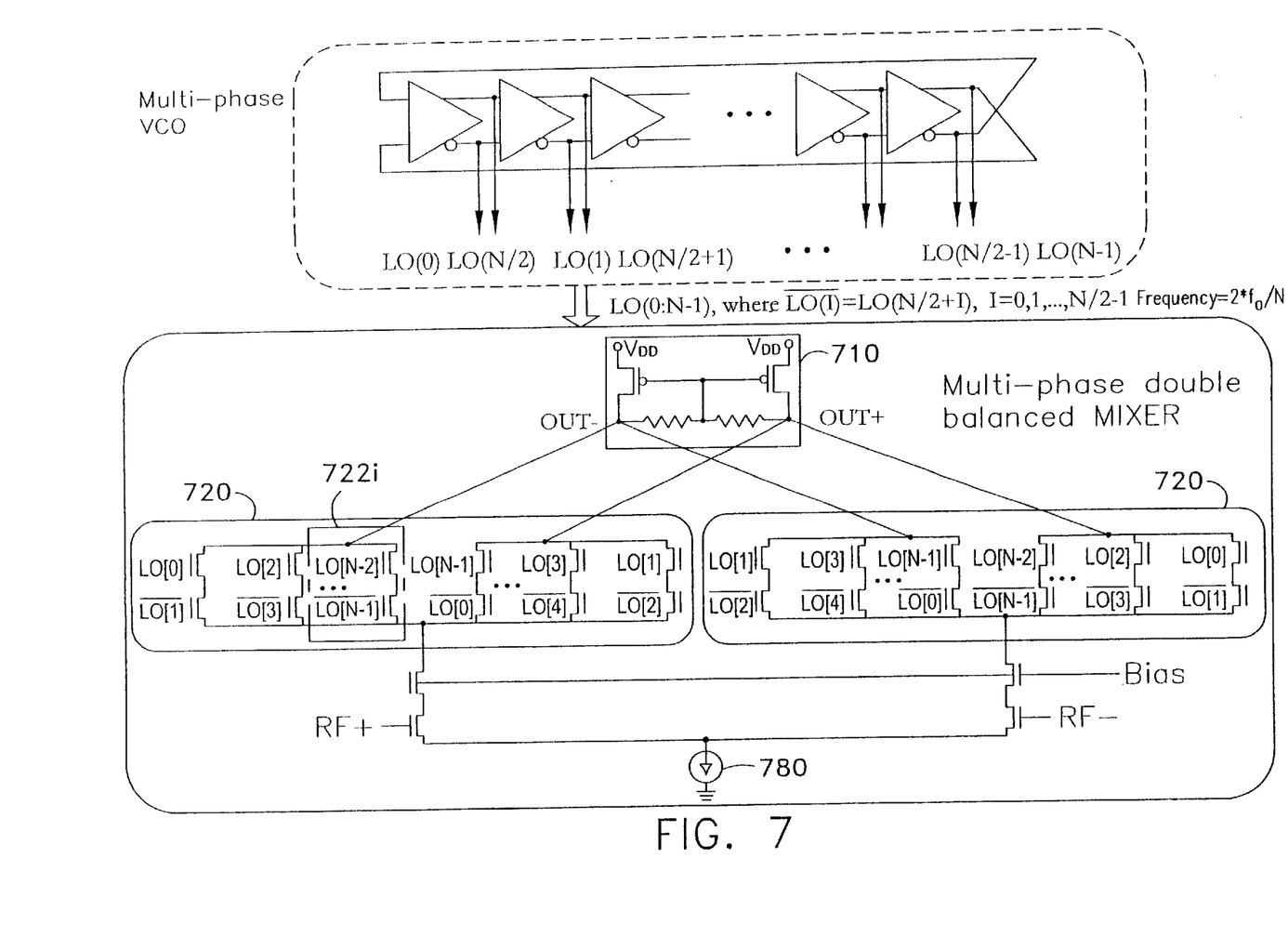
FIG. 7 is a circuit diagram showing still yet another preferred embodiment of a mixer according to the present invention.

Alternatively, in a fourth preferred embodiment of a multi-phase mixer according to the present invention, two double-balanced mixers can be used to construct a quadrature down converter as shown in FIG. 7. A double-balanced mixer 700 receives a differential RF input RF+, RF− in contrast to the single-balanced mixers 500, 600 that can receive a single-ended RF input. As shown in FIG. 7, the multi-phase double-balanced mixer 700 incorporates a single load block 710 commonly coupled to first and second switch arrays 720. Each switch 722$_i$ uses a structure similar to the second preferred embodiment. In addition, a current source 780 coupled between the differential RF input and the ground voltage can be incorporated to improve performance characteristics.

As described above, preferred embodiments of a mixer and methods of using same have various advantages. The preferred embodiments allow robust and low noise VCO and mixer to be fabricated on a single substrate, preferably on a semiconductor substrate using CMOS technology. The preferred embodiments reduce interference caused by the input signal and the input clock signal because the frequency of the multi-phase intermediate clock signals deviate from the carrier signal frequency and the modulation frequency. A phase locked loop (PLL) frequency range can be increased because the PLL frequency range is based on the reduced frequency multi-phase clock signal frequency condition. Moreover, such results can enhance the channel selection capability of RF front-end in a RF communication system.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A circuit, comprising:
    a multi-phase mixer that receives a plurality of first clock signals having different phases, each first clock signal having a first frequency which is less than a second frequency,
    wherein the multi-phase mixer combines the plurality of first clock signals to generate a plurality of local oscillator signals having the second frequency, and wherein the multi-phase mixer multiplies the plurality of local oscillator signals with input signals to provide output signals at output terminals.

2. The circuit of claim 1, wherein the input signals include an I-channel signal and a Q-channel signal, and wherein the multi-phase mixer multiplies the I-channel with one of the plurality of local oscillator signals and multiplies the Q-channel signal with another of the plurality of local oscillator signals.

3. The circuit of claim 1, further comprising a clock generator that receives a reference signal having a reference frequency and generates the plurality of first clock signals, wherein the clock generator includes a plurality of delay cells coupled in series to provide the plurality of first clock signals having different phases, and wherein the input signals are at the reference frequency.

4. The circuit of claim 1, wherein said multi-phase mixer comprises:
    a load circuit coupled to a first prescribed voltage;
    a switch array coupled to the load circuit at terminals providing the output signals, wherein the switch array receives the plurality of first clock signals from the clock generator and outputs the local oscillator signals; and
    an input block coupled to the switch array, wherein the input block receives the input signals and outputs corresponding signals for the switch array.

5. The circuit of claim 4, wherein said multi-phase mixer further comprises a bias transistor between the input block and the switch array.

6. The circuit of claim 4, wherein the load circuit comprises:
    first and second transistors coupled by first electrodes to the first prescribed voltage, wherein the first and second transistors have control electrodes coupled together;
    a first load resistor coupled between the control electrode and a second electrode of the first transistor; and
    a second load resistor coupled between the control electrode and a second electrode of the second transistor.

7. The circuit of claim 4, wherein the switch array comprises:
    a first switch network coupled to receive a first group of the first clock signals and coupled to the load circuit to output a corresponding first local oscillator signal; and
    a second switch network coupled to receive a second group of the first clock signals and coupled to the load circuit to output a corresponding second local oscillator signal.

8. The circuit of claim 7, wherein each of said first and second switch networks comprises a plurality of switches coupled to each other in parallel.

9. The circuit of claim 8, wherein each of said plurality of switches comprises a plurality of transistors coupled in series.

10. The circuit of claim 9, wherein each of the plurality of switches comprises:
    first and third transistors coupled in series between a first node and a second node; and
    second and fourth transistors coupled in series between the first node and the second node, wherein control electrodes of the first and fourth electrodes receive a first control signal and control electrodes of the second and third transistors receive a second control signal.

11. The circuit of claim 10, wherein second electrodes of the first and third electrodes are coupled together, wherein first electrodes of the first and second transistors are coupled to the first node, wherein first electrodes of the third and fourth transistors are coupled together, wherein second electrodes of the second and fourth transistors are coupled together, and wherein the first and second control signals are different ones of the first clock signals.

12. The circuit of claim 8, wherein each of the plurality of switches coupled in parallel includes first and second plurality of transistors coupled in series, wherein each of the plurality of switches receives a different pair of the plurality of first clock signals as its respective control signals.

13. The circuit of claim 4, wherein the switch array combines the plurality of first clock signals to generate the plurality of local oscillator signals having the second frequency substantially the same as the reference frequency and, wherein the input signals have the reference frequency and the output signals are baseband.

14. The circuit of claim 1, wherein the multi-phase mixer includes a switch array coupled to terminals providing the output signals, wherein the switch array receives the plurality of first clock signals and outputs the local oscillator signals.

15. The circuit of claim 14, wherein the switch array includes a plurality of transistor units coupled to each other in parallel, each transistor unit receiving at least one of the plurality of first clock signals as a respective control signal.

16. The circuit of claim 4, wherein the input block receives input voltages of the input signals and outputs corresponding current signals to the switch array.

17. The circuit of claim 16, wherein the input block is a transistor having a gate that receives the input signals, a first electrode coupled to a second prescribed voltage and a second electrode for outputting the corresponding current signals to the switch array.

18. The circuit of claim 1, where in the multi-phase mixer comprises:
   a differential amplifying circuit for receiving the input signals and outputting the output signals; and
   a combining circuit coupled to the differential amplifying circuit for receiving the plurality of first clock signals and outputting the local oscillator signals.

19. A method for processing input signals, comprising:
   generating a plurality of first clock signals having different phases, each first clock signal having a first frequency that is less than a reference frequency of an input signal;
   combining the plurality of first clock signals to generate a plurality of local oscillator signals having a second frequency higher than the first frequency; and
   mixing the plurality of local oscillator signals with the input signal to provide an output signal.

20. The method of claim 19, wherein the output signal is at a baseband frequency.

\* \* \* \* \*